(12) United States Patent
Hawes et al.

(10) Patent No.: US 9,007,867 B2
(45) Date of Patent: Apr. 14, 2015

(54) LOADING TRIM ADDRESS AND TRIM DATA PAIRS

(71) Applicant: Micron Technology, Inc., Boise, ID (US)

(72) Inventors: Mark Hawes, Boise, ID (US); Violante Moschiano, Bacoli (IT)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 13/780,626

(22) Filed: Feb. 28, 2013

(65) Prior Publication Data

US 2014/0241097 A1 Aug. 28, 2014

(51) Int. Cl.
| | |
|---|---|
| G11C 8/00 | (2006.01) |
| G11C 16/20 | (2006.01) |
| G11C 29/02 | (2006.01) |
| G11C 29/44 | (2006.01) |

(52) U.S. Cl.
CPC .............. *G11C 16/20* (2013.01); *G11C 29/028* (2013.01); *G11C 2029/4402* (2013.01)

(58) Field of Classification Search
None
See application file for complete search history.

(56) References Cited

U.S. PATENT DOCUMENTS

| | | | |
|---|---|---|---|
| 7,447,847 B2 | 11/2008 | Louie et al. | |
| 7,463,520 B2 | 12/2008 | Aritome | |
| 7,580,287 B2 | 8/2009 | Aritome | |
| 2001/0003837 A1* | 6/2001 | Norman et al. | 711/5 |
| 2008/0252505 A1* | 10/2008 | Lee et al. | 341/146 |
| 2011/0170353 A1 | 7/2011 | Nguyen | |

* cited by examiner

*Primary Examiner* — James G Norman
(74) *Attorney, Agent, or Firm* — Dicke, Billig & Czaja, PLLC (57) ABSTRACT

Methods of loading trim address and trim data pairs to a trim register array, and apparatus configured to perform such methods. The methods maintain a correspondence between the trim address and the trim data of each trim address and trim data pair in the trim register array. The trim address of a particular trim address and trim data pair corresponds to a storage location of a trim settings array containing trim settings used in performing operations on an array of memory cells. The trim data of the particular trim address and trim data pair corresponds to data to modify a value of the storage location of the trim settings array corresponding to the trim address of the particular trim address and trim data pair.

26 Claims, 6 Drawing Sheets

LOADING TRIM ADDRESS AND TRIM DATA PAIRS

TECHNICAL FIELD

The present disclosure relates generally to integrated circuit devices and, in particular, in one or more embodiments, the present disclosure relates to methods for loading trim address and trim data pairs, e.g., for trim settings of memory access operations, and apparatus to facilitate such methods.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of data-storage structures, using charge-storage structures (e.g., floating gates or charge traps) or other physical phenomena (e.g., phase change or polarization), determine the data state of each cell. Common uses for flash memory include personal computers, personal digital assistants (PDAs), digital cameras, digital media players, cellular telephones, solid state drives and removable memory modules, and the uses are growing.

There is a continuing desire to improve accuracy or flexibility of memory access operations, e.g., erase operations, read operations and write operations (sometimes referred to as program operations). Accuracy and/or flexibility of memory access operations can be facilitated by modifying trim settings used, for example, by a memory device in performing the memory access operations.

For the reasons stated above, and for other reasons stated below which will become apparent to those skilled in the art upon reading and understanding the present specification, there is a need in the art for alternative methods for facilitating improvements in accuracy and/or flexibility of memory access operations.

DETAILED DESCRIPTION

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Figure 1:
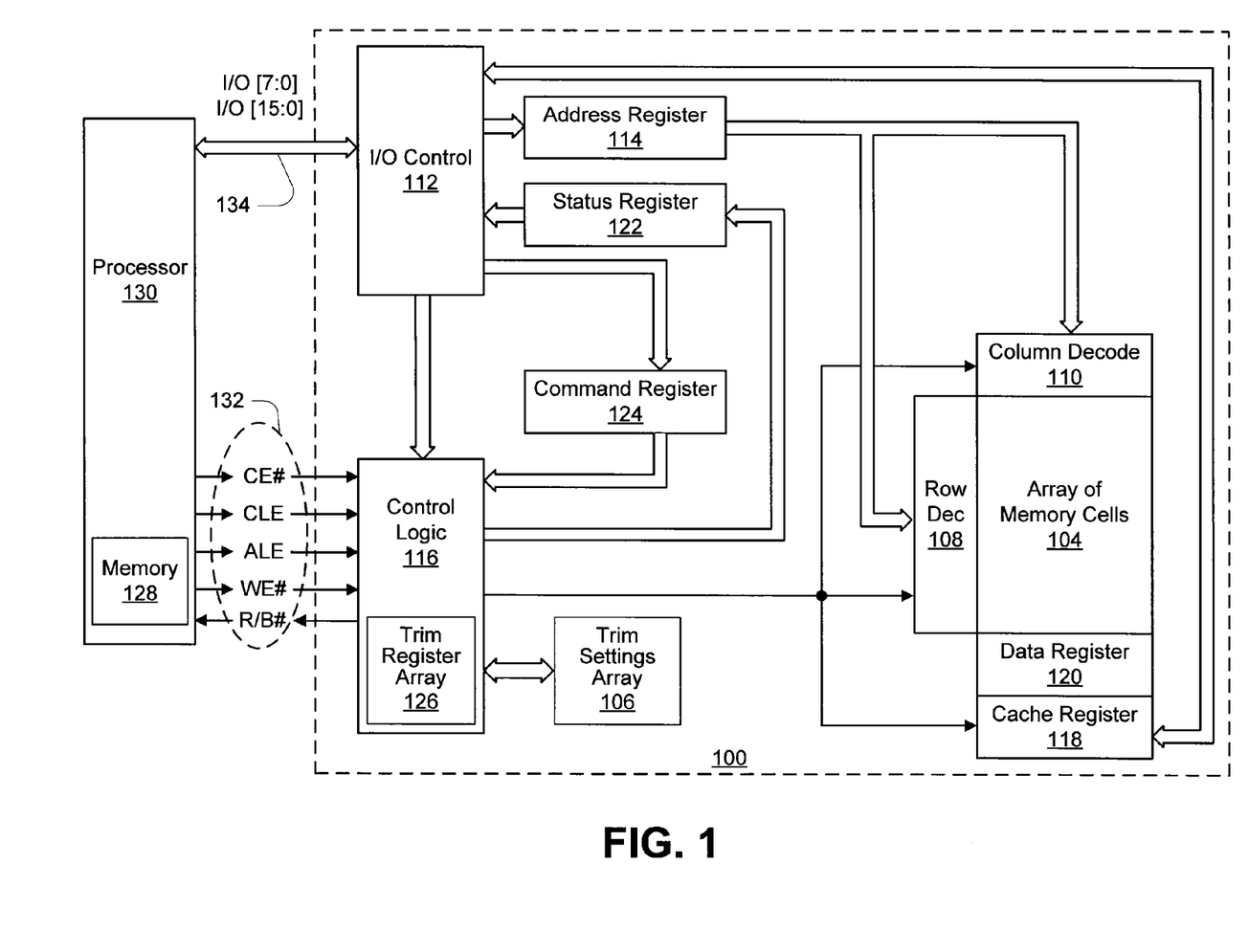
FIG. 1 is a simplified block diagram of a memory device in communication with a controller as part of an electronic system, according to an embodiment.

FIG. 1 is a simplified block diagram of a first apparatus in the form of a memory device 100 in communication with a second apparatus, in the form of an external controller (e.g., processor 130), as part of a third apparatus, in the form of an electronic system, according to an embodiment. Some examples of electronic systems include computer servers, network devices, personal computers, personal digital assistants (PDAs), digital cameras, digital media players, digital recorders, games, appliances, vehicles, wireless devices, cellular telephones and the like.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

Control logic 116 controls access to the array of memory cells 104 in response to the commands and generates status information for the external processor 130. The control logic 116 is in communication with row decode circuitry 108 and column decode circuitry 110 to control the row decode circuitry 108 and column decode circuitry 110 in response to the addresses. Control logic 116 may use trim settings, i.e., values used by the memory device 100 to determine voltages (e.g., read voltage, pass voltage, programming voltage, inhibit voltage, source potential, well potential, etc.), voltage differentials (e.g., voltage step changes in programming pulses during a program operation), timings (e.g., pulse lengths, delays before latching sensed data, delays before outputting data, etc.), limits (e.g., maximum number of programming pulses to be applied before deeming an error, maximum voltage of programming pulse, etc.), etc., used by the memory device 100 during various operations performed by the memory device 100, including memory access operations.

Control logic 116 may be in communication with a trim settings array 106 for storing the trim settings of the memory device 100. It is noted that trim settings array 106 need not directly store a desired value of any particular trim setting, but may instead store a value indicative of the desired value. As an example, if a memory device were configured to provide one of four predefined voltages to a particular access line during a read operation, two digits (e.g., bits) could be used to indicate a particular voltage of the four predefined voltages, e.g., "00"

could be indicative of a first of the four predefined voltages, "01" could be indicative of a second of the four predefined voltages, "10" could be indicative of a third of the four predefined voltages, and "11" could be indicative of a fourth of the four predefined voltages. The trim settings array 106 may have a plurality of addressable storage locations for storing its trim settings.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation, data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the processor 130; then new data is passed from the data register 120 to the cache register 118. A status register 122 is in communication with I/O control circuitry 112 and control logic 116 to latch the status information for output to the processor 130.

Status register 122 may include a ready/busy register. For example, a 1-bit register could be used to indicate whether the memory device 100 is busy, or ready to accept a subsequent command. Thus, reading the status register 122, such as by a controller, could be used to determine whether the memory device 100 is ready to accept a subsequent command. The controller could be an external controller, such as processor 130 (which can be part of a memory controller or other external host device), or an internal controller, such as one including I/O control circuitry 112 and/or control logic 116. Alternatively, or in addition, an internal controller (e.g., control logic 116 of memory device 100) might provide a ready/busy (R/B#) signal to provide an indication to an external controller (e.g., processor 130) of whether or not the memory device 100 is involved in an access operation or otherwise busy. For example, memory devices often provide a pin (e.g., a pin of control link 132) that is asserted to a logic low, for example, when the device is involved in an access operation and is pulled up to a logic high when the device is again available (e.g., not involved in an access operation).

Control logic 116 may also be in communication with a trim register array 126 (although FIG. 1 depicts the trim register array 126 as being internal to the control logic 116, trim register array 126 could also be external to the control logic 116; in either event, the control logic 116 is "in communication with" the trim register array 126) in accordance with an embodiment. The trim register array 126 is configured to store trim address and trim data pairs that can be used to customize access operations of the array of memory cells 104, i.e., to modify values of the trim settings array 106. For example, trim data of a trim address and trim data pair may be written to (e.g., stored in) the trim settings array 106 at a storage location corresponding to the trim address of the trim address and trim data pair to modify (e.g., overwrite) the existing trim setting at that storage location of the trim settings array 106. After a new value of a trim setting is stored to the trim settings array 106, a subsequent operation of the memory device 100 (e.g., a memory access operation) may use the new trim setting, thus altering the behavior of the memory device 100 for that operation.

The operation of trim register array 126 can allow the trim register array 126 to be loaded from an external device, such as processor 130. Processor 130 may be in communication with a memory 128 (although FIG. 1 depicts the memory 128 as being internal to the processor 130, memory 128 could also be external to the processor 130; in either event, the processor 130 is "in communication with" the memory 128) storing trim address and trim data pairs for loading into the trim register array 126, such as in conjunction with a command for loading trim address and trim data pairs. The trim address and trim data pairs of the memory 128 may be user-definable, for example. As one example, processor 130 may be configured to store trim address and trim data pairs to the memory 128 in response to input of a user of the processor 130. The processor 130 may further be configured to generate a command to load trim address and trim data pairs from the memory 128 to the trim register array 126. Generation of the command may be in response to input from a user of the processor 130. Alternatively, or in addition, generation of the command may be in response to a reset (e.g., power-up) of the memory device 100.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received or provided over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. For memory access commands, the memory location addresses are received over input/output (I/O) pins [7:0] of bus 134 at I/O control circuitry 112 and are written into address register 114. The data to be stored to the array of memory cells 104 are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data, e.g., from the array of memory cells 104 or the status register 122, are also output over input/output (I/O) pins [7:0] for an 8-bit device or input/output (I/O) pins [15:0] for a 16-bit device. I/O control circuitry 112 may include data buffers (not shown) to buffer commands, addresses and data received by the I/O control circuitry 112, e.g., from the I/O bus 134, cache register 118 or status register 122.

For commands for loading trim address and trim data pairs to the trim register array 126, the trim addresses received over input/output (I/O) pins [7:0] of bus 134 at I/O control circuitry 112 and are written into trim register array 126. The trim data are received over input/output (I/O) pins [7:0] for an 8-bit device or input/output (I/O) pins [15:0] for a 16-bit device at I/O control circuitry 112 and are also written into trim register array 126.

It will be appreciated by those skilled in the art that additional circuitry and signals can be provided, and that the electronic system of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O and command pins are described in accordance with popular conventions for receipt and output of the various signals, it is noted that other combinations or numbers of pins may be used in various embodiments.

Figure 2A:
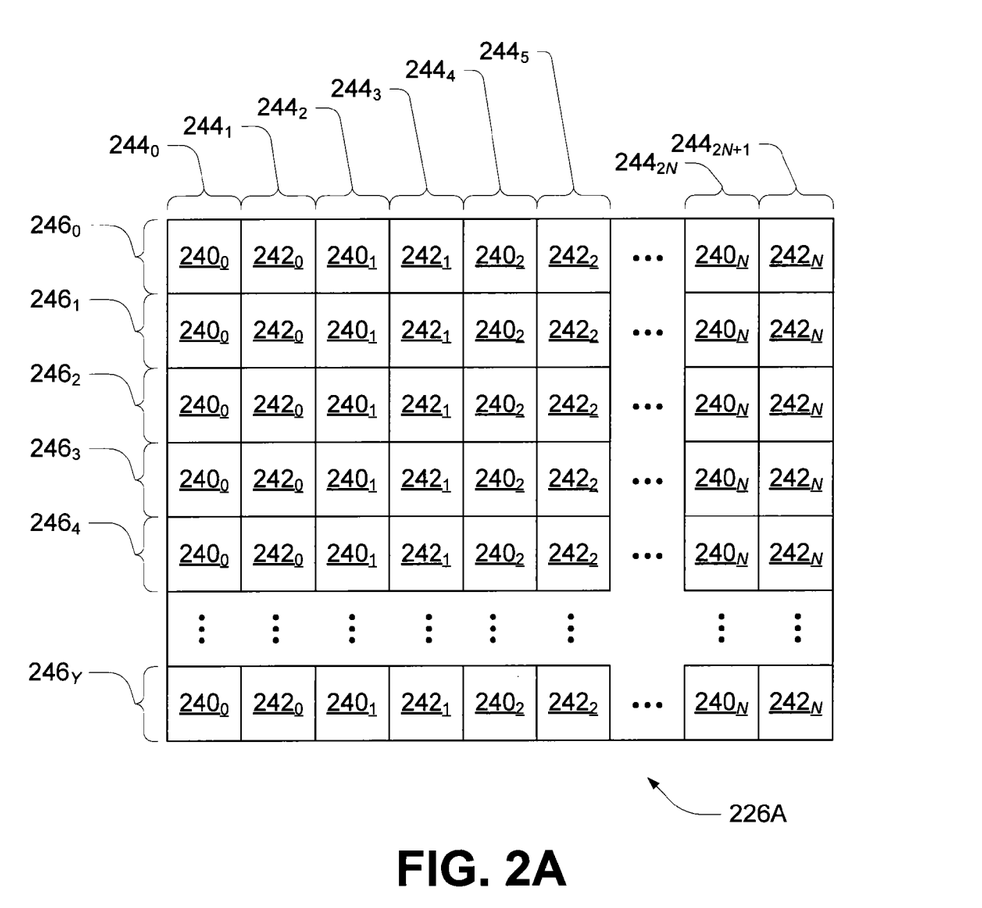
FIGS. 2A-2B are block diagrams of trim register arrays in accordance with embodiments.
Figure 2B:
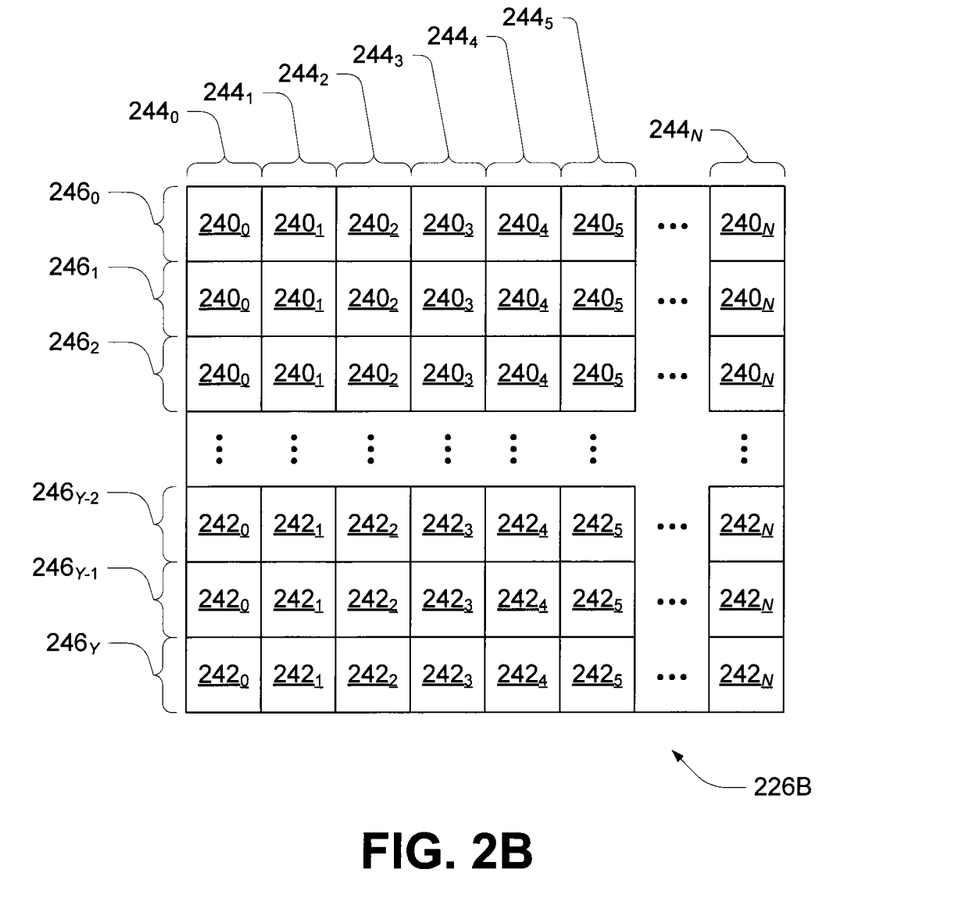

FIGS. 2A-2B are block diagrams of trim register arrays 226 in accordance with embodiments. Trim register arrays 226 (e.g., 226A and 226B) are configured to store trim address and trim data pairs, and to maintain a correspondence between the trim address of a particular trim address and trim data pair, and the trim data of the particular trim address and trim data pair. FIGS. 2A and 2B demonstrate two examples of maintaining that correspondence. A trim register array 226 may represent the trim register array 126 of FIG. 1, for example. Trim register arrays 226 may represent volatile or non-volatile storage. For one embodiment, a trim register array 226 may represent a portion of the array of memory cells 104. For another embodiment, the trim register array 226 may be separate from the array of memory cells. For example, the trim register array 226 may be a static random-access memory (SRAM).

In FIG. 2A, trim register array 226A includes storage locations 240 for storage of first portions of trim address and trim data pairs. For example, the storage locations 240 may store trim addresses. Trim register array 226A further includes storage locations 242 for storage of second portions of trim address and trim data pairs. For example, the storage locations 242 may store trim data. For some embodiments, storage locations 240 and 242 are the same size. For example, each storage location 240 and 242 may represent one byte of information. For other embodiments, storage locations 240 and 242 may be different sizes. For example, address information sufficient to identify where trim data should be stored in a trim settings array 106 may be different in size than the storage location for the corresponding trim setting. Although various examples identify trim addresses as the first portion of trim address and trim data pairs, trim data may instead represent the first portion of the trim address and trim data pairs.

Trim register array 226A may be logically organized into rows 246 (sometimes referred to as tables) and columns 244. For example, trim register array 226A may include tables $246_0$-$246_Y$. Trim register array 226A may further include columns $244_0$-$244_{2N+1}$ for storage of N+1 trim address and trim data pairs (corresponding to a pair of storage locations 240 and 242) in each table 246. For example, storage locations $240_0$ and $242_0$ of a given table 246 may represent one trim address and trim data pair, storage locations $240_1$ and $242_1$ of the given table 246 may represent a subsequent trim address and trim data pair, storage locations $240_2$ and $242_2$ of the given table 246 may represent a subsequent trim address and trim data pair, etc. In the foregoing example, the correspondence for a given trim address and trim data pair is maintained through the use of adjacent (i.e., addresses of a next increment) storage locations of the trim register array 226A. For example, an adjacent storage location of the trim register array 226A may be a storage location having the next higher column address, e.g., storage locations 242 of column $244_1$ are adjacent to storage locations 240 of column $244_0$, storage locations 240 of column $244_2$ are adjacent to storage locations 242 of column $244_1$, storage locations 242 of column $244_3$ are adjacent to storage locations 240 of column $244_2$, etc.

In FIG. 2B, trim register array 226B includes storage locations 240 for storage of first portions of trim address and trim data pairs. For example, the storage locations 240 may store trim addresses. Trim register array 226B further includes storage locations 242 for storage of second portions of trim address and trim data pairs. For example, the storage locations 242 may store trim data. Trim register array 226B may be logically organized into rows 246 (sometimes referred to as tables) and columns 244. For example, trim register array 226B may include tables $246_0$-$246_Y$. Trim register array 226B may further include columns $244_0$-$244_N$ for storage of N+1 trim address and trim data pairs (corresponding to a pair of storage locations 240 and 242) in two tables 246. Correspondence for a given trim address and trim data pair may be maintained through the use of fixed offsets of storage locations of the trim register array 226B. Consider the example where Y=5. Storage location $240_0$ of table $246_0$ and storage location $242_0$ of table $246_{Y-2}$ may represent one trim address and trim data pair, storage location $240_1$ of table $246_0$ and storage location $242_1$ of table $246_{Y-2}$ may represent a subsequent trim address and trim data pair, storage location $240_2$ of table $246_0$ and storage location $242_2$ of table $246_{Y-2}$ may represent a subsequent trim address and trim data pair, etc., and storage location $240_0$ of table $246_1$ and storage location $242_0$ of table $246_{Y-1}$ may represent one trim address and trim data pair, storage location $240_1$ of table $246_1$ and storage location $242_1$ of table $246_{Y-1}$ may represent a subsequent trim address and trim data pair, storage location $240_2$ of table $246_1$ and storage location $242_2$ of table $246_{Y-1}$ may represent a subsequent trim address and trim data pair, etc., where each offset represents a particular address increment.

For some embodiments, a table 246 of a trim register 226 includes trim data corresponding to trim settings of a particular operation of the memory device 100 for a particular condition of the memory device 100. For such embodiments, a particular table 246 could be selected for storage to the trim settings array 106 in order to modify the particular operation. For example, it is known that programming operations often take higher programming voltages to effect programming as the memory device ages. As such, one table 246 could contain trim data corresponding to desired trim settings for a new memory device, another table 246 could contain trim data corresponding to desired trim settings for a memory device after a certain number of program-erase cycles, another table 246 could contain trim data corresponding to desired trim settings for a memory device after a certain higher number of program-erase cycles, etc. Similarly, different tables 246 could be selected for modifying a particular operation in response to different ambient conditions, e.g., different operating temperatures. For other embodiments, different tables 246 could be selected for modifying a particular operation in response to different operating modes, e.g., a test mode versus a normal operating mode.

Figure 3A:
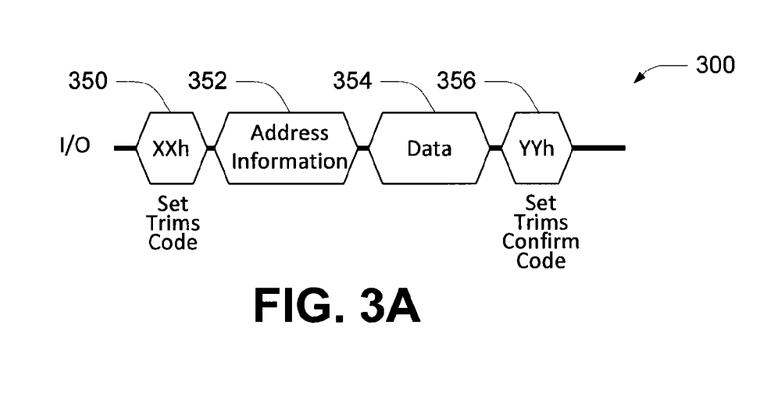
FIG. 3A depicts the structure of a command to load trim address and trim data pairs in accordance with an embodiment.

FIG. 3A depicts the structure of a command 300 to load trim address and trim data pairs in accordance with an embodiment, such as might be received by a memory device 100 from an external device, such as processor 130. The command 300 may include a command code 350 to indicate to the memory device 100 that trim address and trim data pairs are to be loaded to the trim register array 126. The command code 300 may be a hexadecimal code (represented as XXh in FIG. 3A) whose indication the memory device 100 has been configured to recognize. As will be described in more detail with respect to FIG. 3B, the command code 350 may further indicate the expected format of the address and data information associated with the command 300. For example, different command codes 350 (e.g., different hexadecimal codes) may be recognized by the memory device 100 as each indicating a desire to load trim address and trim data pairs, but further indicating different methods of loading those trim address and trim data pairs.

Command 300 may further include address information 352. The address information 352 may indicate to the memory device 100 where the trim address and trim data pairs are to be stored within the trim register 126. Command 300 may further include data 354. The data 354 of the command 300 represents values of the trim addresses and trim data of the trim address and trim data pairs to be stored within the trim register 126. Command 300 may further include a command confirm code 356 to indicate to the memory device 100 that the command 300 is complete. The command confirm code 356 may be a hexadecimal code (represented as YYh in FIG. 3A) whose indication the memory device 100 has been configured to recognize.

Figure 3B:
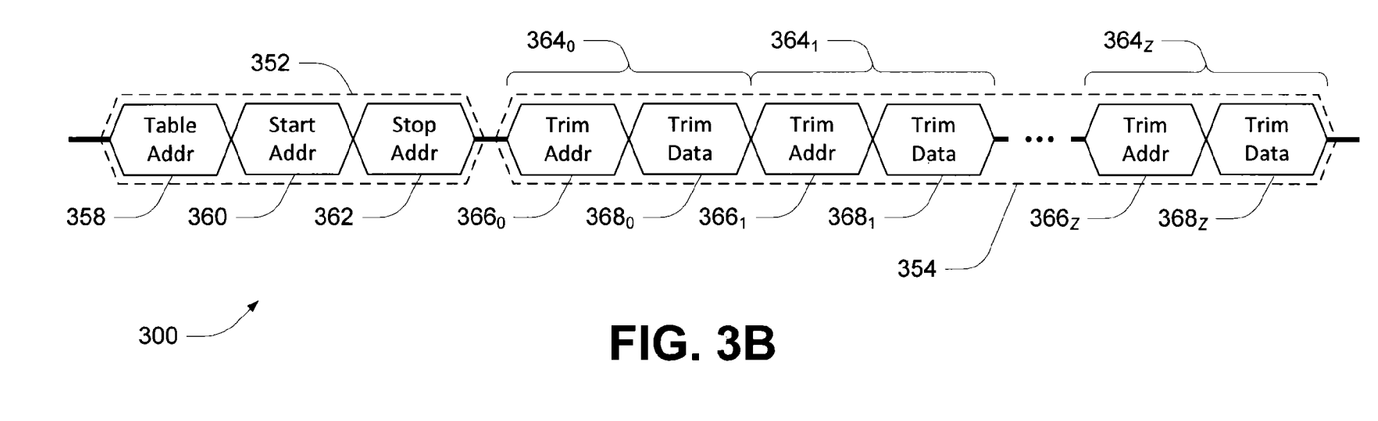
FIG. 3B depicts a portion of the structure of a command to load trim address and trim data pairs in accordance with a further embodiment.

FIG. 3B depicts a portion of the structure of a command 300 to load trim address and trim data pairs in accordance with a further embodiment. FIG. 3B depicts one embodiment of the address information 352 and data 354 of command 300 in additional detail. As depicted in FIG. 3B, the address information 352 may include one or more address portions, e.g., table address 358, start address 360 and stop address 362. For example, table address 358 may represent an address of a table 246 of a trim register array 226 in which loading of the data 354 is to begin. Start address 360 may represent an address of a column 244 of the table 246 where a portion of a first trim address and trim data pair of the command 300 is to be loaded. Stop address 362 may represent the address of a column 244 of the table 246 where a portion of a last trim address and trim data pair of the command 300 is to be loaded.

Data 354 includes one or more trim address and trim data pairs 364. Each trim address and trim data pair 364 includes a first portion 366 and a second portion 368. Although the first portion 366 represents a trim address of the trim address and trim data pair 364, and the second portion 368 represents trim data of the trim address and trim data pair 364, these portions could be swapped, i.e., the first portion 366 could represent trim data of the trim address and trim data pair 364, and the second portion 368 could represent a trim address of the trim address and trim data pair 364, depending upon whether trim addresses are to be stored to storage locations 240 or 242 and whether trim data are to be stored to storage locations 242 or 240, respectively, for example.

For embodiments where command 300 indicates a desire to load a table 246 of a trim register array 226 beginning with its first storage location 240, for example, address information 352 may forego a start address 360, such that the start address of the command 300 corresponds to an initial column 244 of a table 246. As described below, such embodiments may further forego a stop address 360. For embodiments where command 300 further indicates a desire to load an entire table 246 of the trim register array, address information 352 may also forego a stop address 362, such that the stop address of the command 300 corresponds to a last column 244 of that table 246. The data 354 might include trim address and trim data pairs sufficient to fill the table 246 where the command 300 indicates a desire to load the entire table 246. Referring to the trim register array 226A of FIG. 2A, data 354 might include N+1 trim address and trim data pairs (e.g., Z=N) to load columns $244_0$-$244_{2N+1}$ of a given table 246 in this example. Referring to the trim register array 226B of FIG. 2B, data 354 might include N+1 trim address and trim data pairs (e.g., Z=N) to load columns $244_0$-$244_N$ of a given table 246, and its corresponding offset table 246, in this example. Alternatively, data 354 might only include trim address and trim data pairs sufficient to fill a portion of a table 246.

For embodiments where command 300 indicates a desire to load a subset of storage locations of a table 246 of a trim register array 226, for example, address information 352 may contain a table address 358, a start address 360 and, optionally, a stop address 362. The data 354 might include trim address and trim data pairs sufficient to fill the table 246 from its start address 360 to its stop address 362. Consider the example where the start address 360 is an address representing an address of column $244_2$, and the stop address 362 is an address representing an address of column $244_5$. Referring to the trim register array 226A of FIG. 2A, data 354 might include two trim address and trim data pairs (e.g., Z=1) to load columns $244_2$-$244_5$ of a given table 246 in this example. (It is noted in this particular example that the stop address 362 could alternatively represent an address of the corresponding column $244_4$ for the first portion of the last trim address and trim data pair.) Referring to the trim register array 226B of FIG. 2B, data 354 might include four trim address and trim data pairs (e.g., Z=3) to load columns $244_2$-$244_5$ of a given table 246, and its corresponding offset table 246, in this example.

For some embodiments where command 300, for example, indicates a desire to load a subset of storage locations of a table 246 of a trim register 226, the stop address 362 may be eliminated. For example, the command 300 could indicate a desire to begin loading trim address and trim data pairs to a table 246 at a particular start address 360, and could continue to load trim address and trim data pairs to subsequent storage locations of the table 246 until there is no more data 354. In this example, the command confirm code 356 could indicate that no further trim address and trim data pairs are to be loaded.

Figure 4:
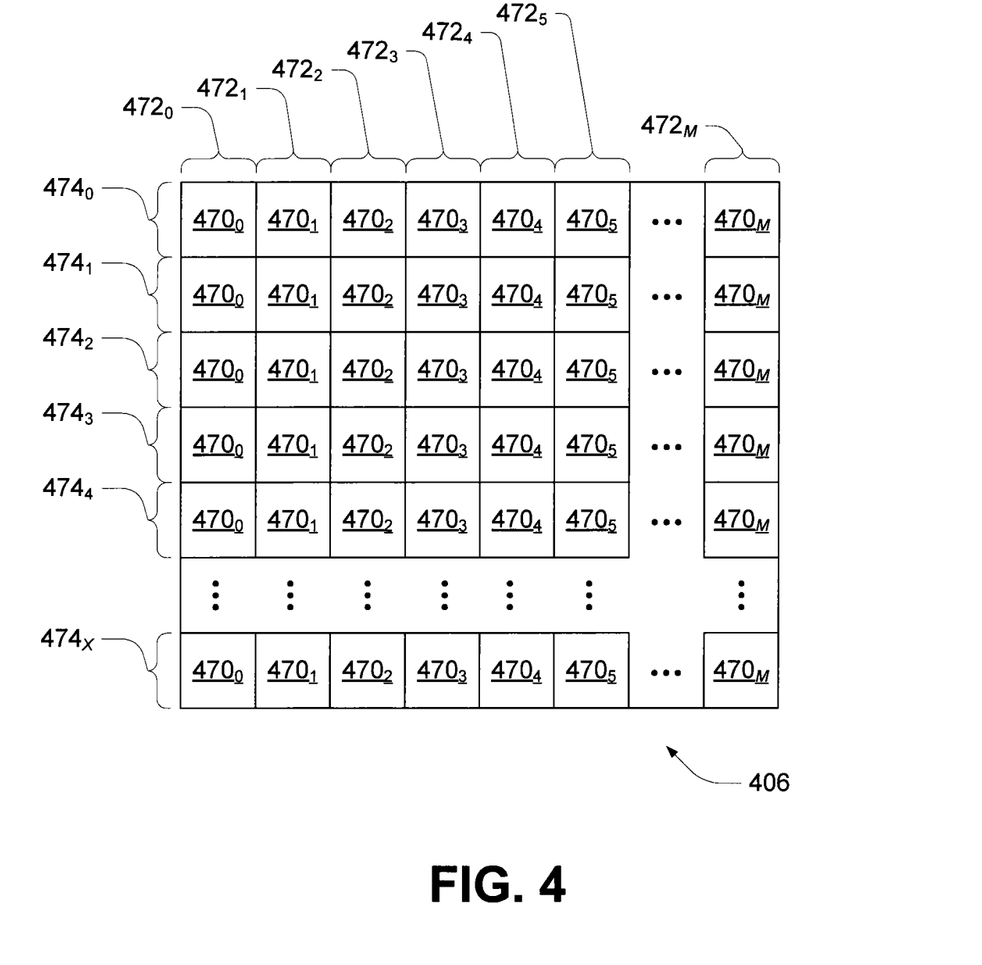
FIG. 4 is a block diagram of trim settings array in accordance with an embodiment.

FIG. 4 is a block diagram of trim settings array in accordance with an embodiment. Trim settings array 406 may represent trim settings array 106 of FIG. 1, for example. In FIG. 4, trim settings array 406 includes storage locations 470 for storage of trim settings. Trim settings array 406 may be logically organized into rows 474 and columns 472. For example, trim settings array 406 may include rows $474_0$-$474_X$. Trim settings array 406 may further include columns $472_0$-$472_M$ for storage of M trim settings in each row 474. The storage locations 470 may be of the same size as the storage locations (e.g., storage locations 240 or 242) used for storage of trim data of the trim address and trim data pairs. The storage locations 470 may store more than one trim setting. For example, if storage locations 470 have a size of one byte of information, a storage location 470 could store four two-bit trim settings, or two three-bit trim settings and one two-bit trim setting, or one six-bit trim setting and two one-bit trim settings, etc.

In practice, a trim address stored in a trim register array 226 may identify a storage location 470 of trim settings array 406, e.g., by an address representing a particular row 474 and column 472 of the trim settings array 406. It is noted that trim addresses stored in a particular table 246 of a trim register array 226 need not correspond to addresses of only one row of the trim settings array 406. For example, one trim address of a particular table 246 of a trim register array 226 might represent an address of row $474_1$ of trim settings array 406, another trim address of the particular table 246 might represent an address of row $474_4$ of trim settings array 406, and another trim address of the particular table 246 might represent an address of row $474_X$ of trim settings array 406. Because each instance of trim data stored in the trim register array 226 is paired with a corresponding trim address of the trim settings array 406, no correspondence between the order or sequence of the trim register array 226 and the trim settings array 406 is necessary as each trim address and trim data pair can uniquely identify where its corresponding trim data should be stored.

Figure 5:
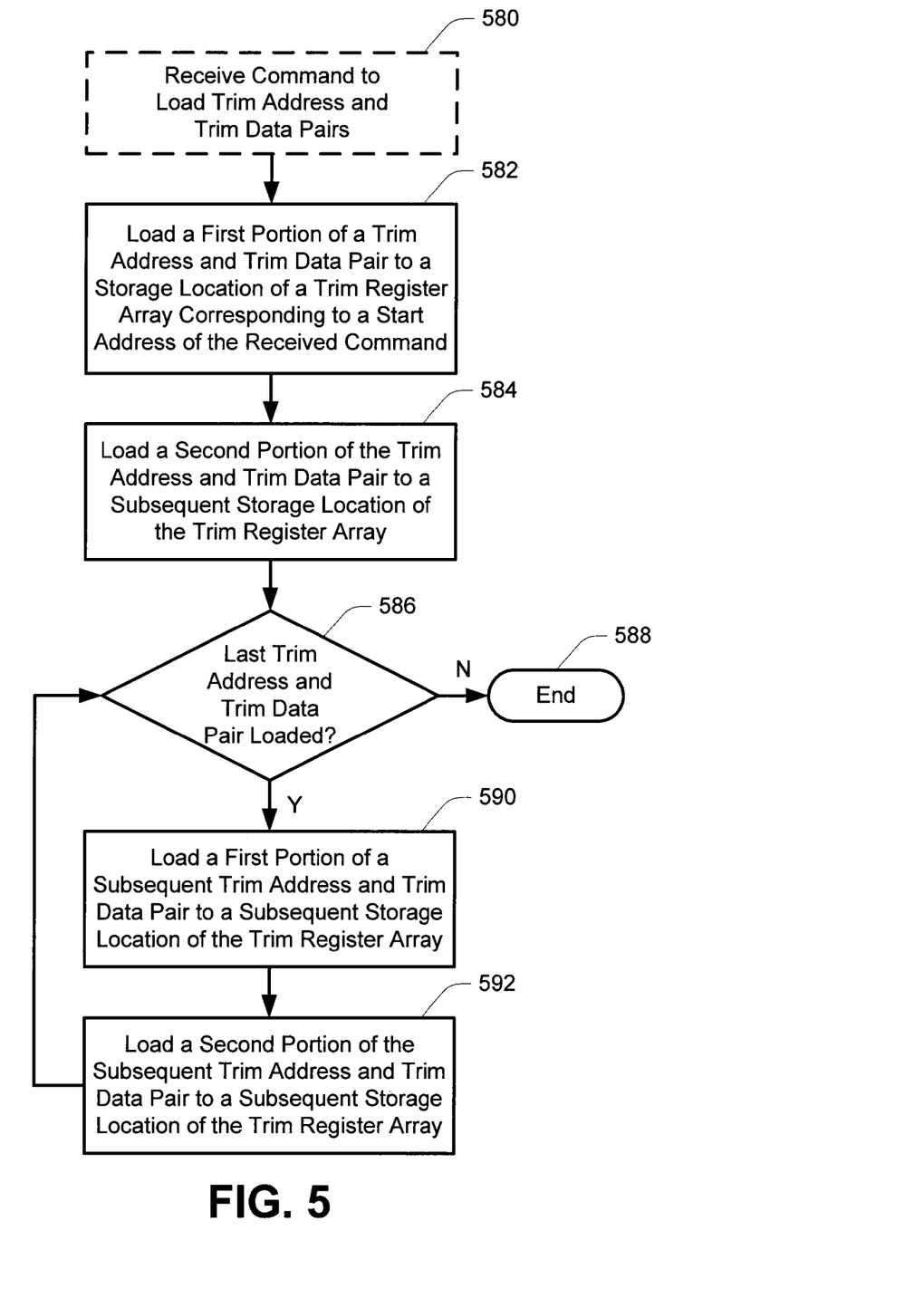
FIG. 5 is a flowchart of a method of operating a memory device in accordance with an embodiment.

FIG. 5 is a flowchart of a method of operating a memory device in accordance with an embodiment. At 580, a command to load trim address and trim data pairs may be received by the memory device. The command, e.g., a command code, address, data and confirm code, might be received from an external device, such as an external controller (e.g., processor 130) in communication with the memory device. At 582, a first portion of a trim address and trim data pair is loaded (e.g., stored) to a storage location of a trim register array corresponding to a start address of the received command. The start address of the command may be presumed, as noted above, or it may be included with the command. At 584, a second portion of the trim address and trim data pair is loaded (e.g., stored) to a subsequent storage location of the trim register array. The subsequent storage location of the trim register array in step 584 may be an adjacent (e.g., incremented) storage location of the trim register array (see, e.g., discussion with reference to FIG. 2A). Alternatively, the subsequent storage location of the trim register array in step 584 may be an offset storage location of the trim register array (see, e.g., discussion with reference to FIG. 2B).

At 586, a determination is made whether a last trim address and trim data pair has been loaded. The determination may be in response to a stop address of the command corresponding to an address of a storage location of the trim register array in which a portion (e.g., either the first portion or the second portion) of the most recent (e.g., prior) trim address and trim data pair was loaded. The stop address of the command may be presumed, as noted above, or it may be included with the command. Alternatively, the determination may be in response to receiving the command confirm code. If it is determined that the last trim address and trim data pairs of the command has been loaded, the process ends at 588. If further trim address and trim data pairs of the command are to be loaded, the process continues at 590.

At 590, a first portion of a subsequent trim address and trim data pair is loaded (e.g., stored) to a subsequent storage location of the trim register array. The subsequent storage location of the trim register array in step 590 may be adjacent to the storage location of the trim register array in which the second portion of the prior trim address and trim data pair was loaded (see, e.g., discussion with reference to FIG. 2A). Alternatively, the subsequent storage location of the trim register array in step 590 may be adjacent to the storage location of the trim register array in which the first portion of the prior trim address and trim data pair was loaded (see, e.g., discussion with reference to FIG. 2B). At 592, a second portion of the subsequent trim address and trim data pair is loaded (e.g., stored) to a subsequent storage location of the trim register array. The subsequent storage location of the trim register array in step 592 may be adjacent to the storage location of the trim register array in which the first portion of the subsequent trim address and trim data pair was loaded (see, e.g., discussion with reference to FIG. 2A). Alternatively, the subsequent storage location of the trim register array in step 592 may be offset from the storage location of the trim register array in which the first portion of the subsequent trim address and trim data pair was loaded (see, e.g., discussion with reference to FIG. 2B). The process can then return to 586 to determine if further iterations of loading further subsequent trim address and trim data pairs is desired.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method, comprising:
    loading trim address and trim data pairs to a trim register array; and
    maintaining a correspondence between the trim address and the trim data of each trim address and trim data pair in the trim register array;
    wherein the trim address of a particular trim address and trim data pair corresponds to a storage location of a trim settings array containing trim settings used in performing operations on an array of memory cells; and
    wherein the trim data of the particular trim address and trim data pair corresponds to data to modify a value of the storage location of the trim settings array corresponding to the trim address of the particular trim address and trim data pair.

2. The method of claim 1, wherein maintaining a correspondence between the trim address and the trim data of each trim address and trim data pair in the trim register array comprises storing portions of the particular trim address and trim data pair in adjacent columns of a particular table of the trim register array.

3. The method of claim 1, wherein maintaining a correspondence between the trim address and the trim data of each trim address and trim data pair in the trim register array comprises storing portions of the particular trim address and trim data pair in offset storage locations of the trim register array.

4. The method of claim 1, wherein storing portions of the particular trim address and trim data pair in offset storage locations of the trim register array comprises storing the portions of the particular trim address and trim data pair in different tables of the trim register array in storage locations occurring at a particular column of the trim register array.

5. A method, comprising:
    loading a first portion of a trim address and trim data pair to a storage location of a trim register array corresponding to a start address of a received command;
    loading a second portion of the trim address and trim data pair to a subsequent storage location of the trim register array; and
    determining if the trim address and trim data pair is a last trim address and trim data pair to be loaded to the trim register array in response to the received command;
    wherein the trim address of the trim address and trim data pair corresponds to a storage location of a trim settings array containing trim settings used in performing operations on an array of memory cells; and
    wherein the trim data of the trim address and trim data pair corresponds to data to modify a value of the storage location of the trim settings array corresponding to the trim address of the trim address and trim data pair.

6. The method of claim 5, wherein loading a first portion of a trim address and trim data pair comprises loading either a trim address or trim data of the trim address and trim data pair.

7. The method of claim 6, wherein loading a second portion of the trim address and trim data pair comprises loading a remaining portion of the trim address and trim data pair.

8. The method of claim 5, further comprising wherein the received command indicates that the start address is presumed to correspond to an initial column of the trim register array.

9. The method of claim 5, further comprising wherein address information of the received command includes the start address, and wherein the start address corresponds to a particular column of the trim register array.

10. The method of claim 5, wherein determining if the trim address and trim data pair is a last trim address and trim data pair to be loaded to the trim register array in response to the received command comprises determining if an address of the storage location to which the first portion of the trim address and trim data pair was loaded, or an address of the subsequent storage location to which the second portion of the trim address and trim data pair was loaded, corresponds to a stop address of the received command.

11. The method of claim 5, wherein determining if the trim address and trim data pair is a last trim address and trim data pair to be loaded to the trim register array in response to the received command comprises determining if a command confirm code was received.

12. The method of claim 5, wherein loading a second portion of the trim address and trim data pair to a subsequent storage location of the trim register array comprises loading the second portion of the trim address and trim data pair to a subsequent storage location of the trim register array adjacent the storage location to which the first portion of the trim address and trim data pair was loaded.

13. The method of claim 5, wherein loading a second portion of the trim address and trim data pair to a subsequent storage location of the trim register array comprises loading the second portion of the trim address and trim data pair to a subsequent storage location of the trim register array offset by a fixed amount from the storage location to which the first portion of the trim address and trim data pair was loaded.

14. The method of claim 13, wherein the fixed amount of the offset is a particular address increment from the storage location to which the first portion of the trim address and trim data pair was loaded.

15. The method of claim 5, further comprising:
if it is determined that the trim address and trim data pair is not the last trim address and trim data pair to be loaded to the trim register array in response to the received command:
  loading a first portion of a subsequent trim address and trim data pair to a subsequent storage location of the trim register array; and
  loading a second portion of the subsequent trim address and trim data pair to a subsequent storage location of the trim register array.

16. The method of claim 15, further comprising:
repeating loading a first portion of a subsequent trim address and trim data pair and loading a second portion of a subsequent trim address and trim data pair in like manner until a most recently loaded trim address and trim data pair is determined to be the last trim address and trim data pair to be loaded to the trim register array in response to the received command.

17. The method of claim 15, wherein loading a first portion of a subsequent trim address and trim data pair to a subsequent storage location of the trim register array comprises loading the first portion of the subsequent trim address and trim data pair to a subsequent storage location of the trim register array that is adjacent to a storage location of the trim register array to which a second portion of a prior trim address and trim data pair was loaded.

18. The method of claim 17, wherein loading a second portion of the subsequent trim address and trim data pair to a subsequent storage location of the trim register array comprises loading the second portion of the subsequent trim address and trim data pair to a subsequent storage location of the trim register array that is adjacent to the storage location of the trim register array in which the first portion of the subsequent trim address and trim data pair was loaded.

19. The method of claim 15, wherein loading a first portion of a subsequent trim address and trim data pair to a subsequent storage location of the trim register array comprises loading the first portion of the subsequent trim address and trim data pair to a subsequent storage location of the trim register array that is adjacent to a storage location of the trim register array to which a first portion of a prior trim address and trim data pair was loaded.

20. The method of claim 17, wherein loading a second portion of the subsequent trim address and trim data pair to a subsequent storage location of the trim register array comprises loading the second portion of the subsequent trim address and trim data pair to a subsequent storage location of the trim register array that is offset by a fixed amount from the storage location of the trim register array in which the first portion of the subsequent trim address and trim data pair was loaded.

21. A method, comprising:
receiving a command indicating a desire to load trim address and trim data pairs to a trim register array, wherein the command comprises a command code, address information comprising a table address and a start address, and data comprising one or more trim address and trim data pairs;
loading a first portion of a first trim address and trim data pair to a particular table of the trim register array corresponding to the table address of the received command in an initial storage location of the table occurring at a particular column of the table corresponding to the start address of a received command;
loading a second portion of the first trim address and trim data pair to a subsequent storage location of the trim register array selected from the group consisting of a storage location adjacent the initial storage location and a storage location offset from the initial storage location by a particular amount; and
determining if the first trim address and trim data pair is a last trim address and trim data pair of the one or more trim address and trim data pairs of the received command;
wherein the trim address of the first trim address and trim data pair corresponds to a storage location of a trim settings array containing trim settings used in performing operations on an array of memory cells; and
wherein the trim data of the first trim address and trim data pair corresponds to data to modify a value of the storage location of the trim settings array corresponding to the trim address of the first trim address and trim data pair.

22. The method of claim 21, further comprising:
if it is determined that the first trim address and trim data pair is not the last trim address and trim data pair:
  loading a first portion of a subsequent trim address and trim data pair to a subsequent storage location of the trim register array selected from the group consisting of a storage location adjacent a storage location of a second portion of a prior trim address and trim data pair, and a storage location adjacent a storage location of a first portion of the prior trim address and trim data pair; and
  loading a second portion of the subsequent trim address and trim data pair to a subsequent storage location of the trim register array selected from the group consisting of a storage location adjacent the storage location of the first portion of the subsequent trim address and trim data pair, and a storage location offset from the storage location of the first portion of the subsequent trim address and trim data pair by the particular amount.

23. The method of claim 22, further comprising:
repeating loading a first portion of a subsequent trim address and trim data pair and loading a second portion of a subsequent trim address and trim data pair in like manner until a most recently loaded trim address and trim data pair is determined to be the last trim address and trim data pair of the one or more trim address and trim data pairs of the received command.

24. An apparatus, comprising:
an array of memory cells;
a controller;
a trim register array in communication with the controller and comprising a plurality of storage locations for trim addresses of trim address and trim data pairs, and a plurality of storage locations for trim data of trim address and trim data pairs; and
a trim settings array in communication with the controller and comprising a plurality of storage locations for trim settings;
wherein the controller is configured to load trim address and trim data pairs to the trim register array in response to a command received by the apparatus;
wherein the controller is further configured to maintain a correspondence between the trim address and the trim data of each trim address and trim data pair in the trim register array;
wherein the controller is further configured to perform an operation on the array of memory cells using trim settings from the trim settings array; and
wherein the controller is further configured to permit modification of the trim settings array by loading the trim data of a given trim address and trim data pair to a storage location of the trim settings array corresponding to the trim address of the given trim address and trim data pair.

25. An apparatus, comprising:
an array of memory cells;
a controller;
a trim register array in communication with the controller and comprising a plurality of storage locations for trim addresses of trim address and trim data pairs, and a plurality of storage locations for trim data of trim address and trim data pairs; and
a trim settings array in communication with the controller and comprising a plurality of storage locations for trim settings;
wherein the controller is configured to load a first portion of a first trim address and trim data pair to a storage location of the trim register array corresponding to a start address of a command received by the apparatus indicating a desire to load trim address and trim data pairs;
wherein the controller is further configured to load a second portion of the first trim address and trim data pair to a subsequent storage location of the trim register array selected from the group consisting of a storage location adjacent the storage location of the first portion of the first trim address and trim data pair, and a storage location offset from the storage location of the first portion of the first trim address and trim data pair by a particular amount;
wherein the trim address of the first trim address and trim data pair identifies a storage location of the plurality of storage locations in the trim settings array, and wherein the storage location of the plurality of storage locations in the trim settings array identified by the trim address of the first trim address and trim data pair is configured to store the trim data of the first trim address and trim data pair;
wherein the controller is further configured to determine if the first trim address and trim data pair is a last trim address and trim data pair to be loaded to the trim register array in response to the received command; and
wherein, if the controller determines that the first trim address and trim data pair is not the last trim address and trim data pair to be loaded to the trim register array in response to the command, the controller is further configured to:
load a first portion of a subsequent trim address and trim data pair to a subsequent storage location of the trim register array selected from the group consisting of a storage location adjacent a storage location of the second portion of the first trim address and trim data pair, and a storage location adjacent a storage location of the first portion of the first trim address and trim data pair; and
load a second portion of the subsequent trim address and trim data pair to a subsequent storage location of the trim register array selected from the group consisting of a storage location adjacent the storage location of the first portion of the subsequent trim address and trim data pair, and a storage location offset from the storage location of the first portion of the subsequent trim address and trim data pair by the particular amount.

26. The apparatus of claim 25, wherein the controller is further configured to repeat loading a first portion of a subsequent trim address and trim data pair and loading a second portion of a subsequent trim address and trim data pair in like manner until a most recently loaded trim address and trim data pair is determined to be the last trim address and trim data pair to be loaded to the trim register array in response to the received command.

* * * * *